United States Patent
Ifuku et al.

(10) Patent No.: US 12,018,375 B2
(45) Date of Patent: Jun. 25, 2024

(54) FLIM FORMING METHOD OF CARBON-CONTAINING FILM BY MICROWAVE PLASMA

(71) Applicant: Tokyo Electron Limited, Tokyo (JP)

(72) Inventors: Ryota Ifuku, Nirasaki (JP); Takashi Matsumoto, Nirasaki (JP); Masahito Sugiura, Nirasaki (JP); Makoto Wada, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 744 days.

(21) Appl. No.: 17/106,521

(22) Filed: Nov. 30, 2020

(65) Prior Publication Data

US 2021/0164103 A1 Jun. 3, 2021

(30) Foreign Application Priority Data

Dec. 3, 2019 (JP) .................................. 2019-218515

(51) Int. Cl.
| | |
|---|---|
| *C23C 16/511* | (2006.01) |
| *C23C 16/26* | (2006.01) |
| *C23C 16/44* | (2006.01) |
| *H01J 37/32* | (2006.01) |
| *H01L 21/02* | (2006.01) |

(52) U.S. Cl.
CPC ............ *C23C 16/511* (2013.01); *C23C 16/26* (2013.01); *C23C 16/4405* (2013.01); *H01J 37/32192* (2013.01); *H01J 37/32715* (2013.01); *H01J 37/32816* (2013.01); *H01J 37/32862* (2013.01); *H01L 21/02115* (2013.01); *H01L 21/02274* (2013.01); *H01J 2237/3321* (2013.01); *H01J 2237/3323* (2013.01)

(58) Field of Classification Search
CPC ......... H01J 37/32192; H01J 2237/3321; H01J 37/32862; H01L 21/02274; H01L 21/02115
See application file for complete search history.

(56) References Cited

U.S. PATENT DOCUMENTS 8,536,065 B2 *  9/2013 Seamons ............. C23C 16/0272
                                                      438/758
2021/0151348 A1 *  5/2021 Utsuno .............. H01L 21/31122

FOREIGN PATENT DOCUMENTS

JP    2014-167142 A    9/2014
KR    1020070110428 A  11/2007

* cited by examiner

*Primary Examiner* — Jay C Chang
*Assistant Examiner* — Mikka Liu
(74) *Attorney, Agent, or Firm* — Nath, Goldberg & Meyer; Jerald L. Meyer; Tanya E. Harkins

(57) ABSTRACT

There is provided a film forming method of forming a carbon-containing film by a microwave plasma from a microwave source, the film forming method including: a dummy step of performing a dummy process by generating plasma of a first carbon-containing gas within a processing container; a placement step of placing a substrate on a stage within the processing container; and a film forming step of forming the carbon-containing film on the substrate using plasma of a second carbon-containing gas.

21 Claims, 9 Drawing Sheets

FIG. 6

| Step | Preprocessing | Stabilization processing | | Main processing |
|---|---|---|---|---|
| | S11: Pretreatment | S12: Stabilization | S13: Application | S14: Pressure control | S15: Supplying film formation gas |
| Dummy | H2 plasma 10min | Ar/H2 | Ar/H2 MW on | High pressure → Low pressure | C2H2 on |
| Film formation | H2 anneal 5min | Ar | Ar MW on | High pressure → Low pressure | C2H2/H2 on |

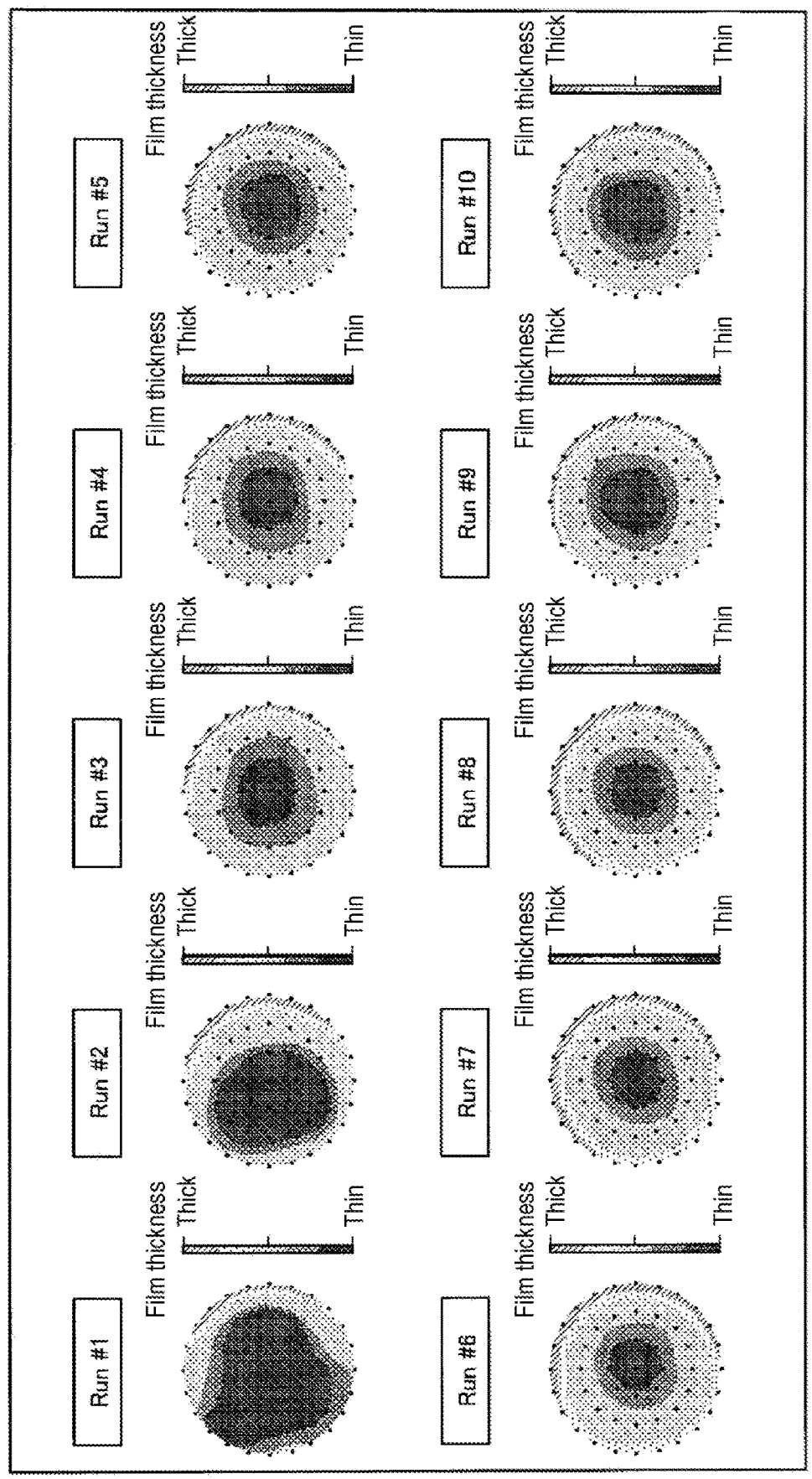

FLIM FORMING METHOD OF CARBON-CONTAINING FILM BY MICROWAVE PLASMA

CROSS-REFERENCE TO RELATED APPLICATION

This application is based upon and claims the benefit of priority from Japanese Patent Application No. 2019-218515, filed on Dec. 3, 2019, the entire contents of which are incorporated herein by reference.

TECHNICAL FIELD

The present disclosure relates to a film forming method and a processing apparatus.

BACKGROUND

Conventionally, there is a technique for forming a carbon-containing film on a substrate to be processed (hereinafter, also referred to as a "wafer") using a plasma chemical vapor deposition (CVD) method.

PRIOR ART DOCUMENT

Patent Document

Patent Document 1: Japanese Laid-Open Patent Publication No. 2014-167142

SUMMARY

According to one embodiment of the present disclosure, there is provided a film forming method of forming a carbon-containing film by microwave plasma from a microwave source. The film forming method includes: a dummy step of performing a dummy process by generating plasma of a first carbon-containing gas within a processing container; a placement step of placing a substrate on a stage within the processing container; and a film forming step of forming a carbon-containing film on the substrate using plasma of a second carbon-containing gas

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 6 is a view illustrating a detailed example of a dummy step and a film forming step according to the present embodiment.

FIG. 10 is a view illustrating an example of in-plane film thickness distribution of wafers subjected to continuous film formation in the comparative example.

DETAILED DESCRIPTION

Hereinafter, embodiments of a film forming method and a processing apparatus disclosed herein will be described in detail with reference to the drawings. The technology disclosed herein is not limited by the following embodiments. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

When continuously forming a graphene film as a carbon-containing film on a plurality of wafers, it is required to improve inter-wafer stability and a processing capacity of the film formation process. It is known that a plasma CVD method includes performing a pre-coating in order to improve the inter-wafer stability when film formation is continuously performed on a plurality of wafers. However, when forming a graphene film on the wafer, carbon on the inner wall of a processing container (hereinafter, also referred to as a "chamber") is etched by hydrogen introduced for controlling the formation of the graphene film, which changes the condition of the chamber. As a result, when a graphene film is continuously formed, the in-plane film thickness distribution becomes non-uniform between the wafers. Therefore, it is desired to improve the film thickness uniformity between wafers in continuous film formation.

[Configuration of Substrate Processing Apparatus 100]

Figure 1:
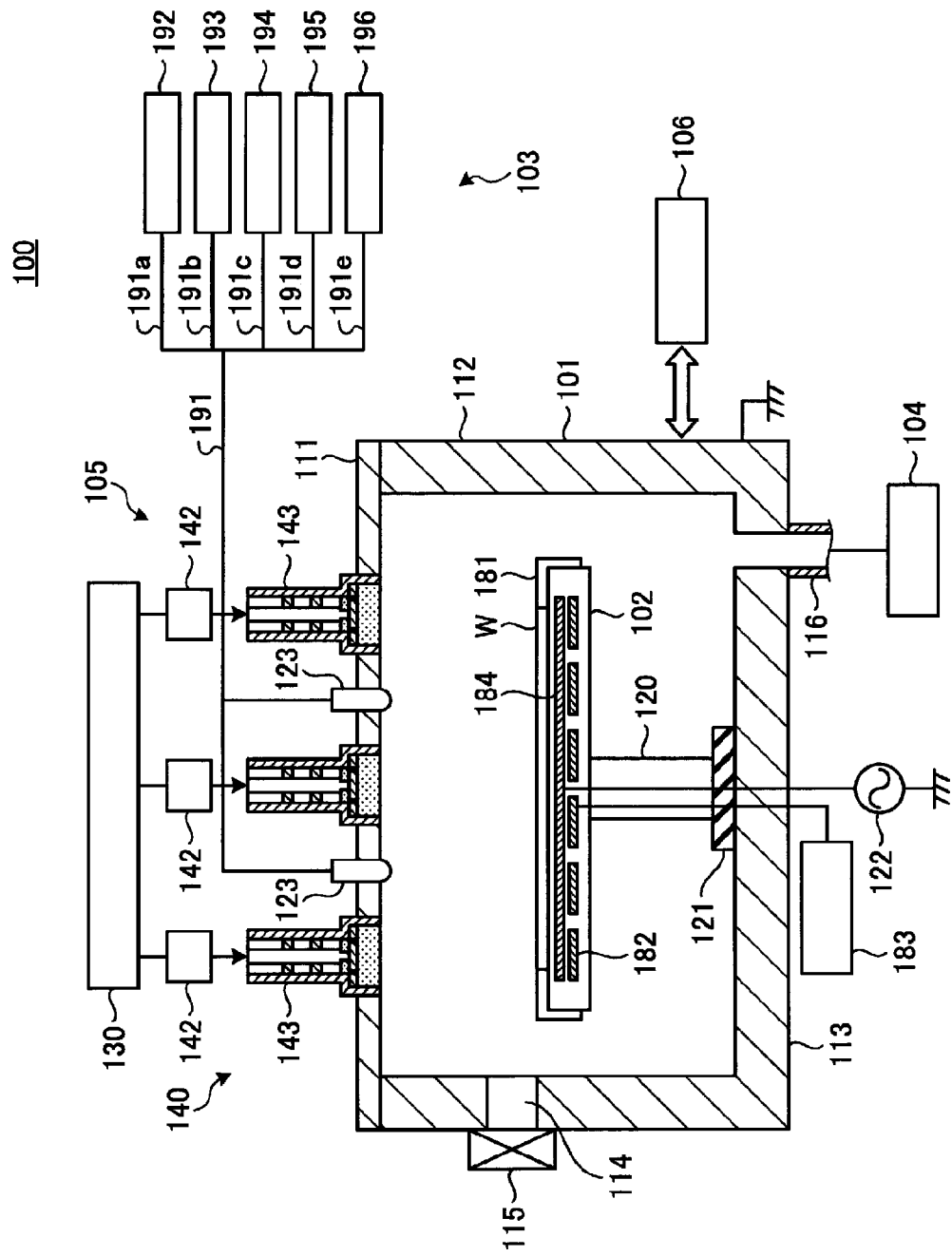
FIG. 1 is a view illustrating an example of a processing apparatus according to an embodiment of the present disclosure.

FIG. 1 is a view illustrating an example of a processing apparatus according to an embodiment of the present disclosure. The processing apparatus 100 illustrated in FIG. 1 includes a processing container 101, a stage 102, a gas supply mechanism 103, an exhaust device 104, a microwave introduction device 105, and a controller 106. The processing container 101 accommodates a wafer W. The wafer W is placed on the stage 102. The gas supply mechanism 103 supplies gases into the processing container 101. The exhaust device 104 exhausts the interior of the processing container 101. The microwave introduction device 105 generates microwaves for generating plasma inside the processing container 101 and introduces the microwaves into the processing container 101. The controller 106 controls the operation of each part of the processing apparatus 100.

The processing container 101 is formed of a metallic material, such as aluminum or an alloy thereof, has a substantially cylindrical shape, and has a plate-shaped ceiling wall portion 111, a bottom wall portion 113, and a side wall portion 112 connecting the ceiling wall portion 111 and the bottom wall portion 113. The microwave introduction device 105 is provided above the processing container 101, and functions as a plasma generator that introduces electromagnetic waves (microwaves) into the processing container 101 so as to generate plasma. The microwave introduction device 105 will be described in detail later.

The ceiling wall portion 111 has a plurality of openings into which a microwave radiation mechanism and a gas introduction part (to be described later) of the microwave introduction device 105 are fitted. The side wall portion 112 has a loading/unloading port 114 for loading/unloading the wafer W therethrough, which is a substrate to be processed, into/from a transfer chamber (not illustrated) provided adjacent to the processing container 101. The loading/unloading port 114 is opened/closed by a gate valve 115. The exhaust device 104 is provided on the bottom wall portion 113. The exhaust device 104 is connected to an exhaust pipe 116 connected to the bottom wall portion 113, and includes a vacuum pump and a pressure control valve. The interior of the processing container 101 is exhausted through the exhaust pipe 116 by the vacuum pump of the exhaust device 104. An internal pressure of the processing container 101 is controlled by the pressure control valve.

The stage 102 has a disc shape and is made of ceramic, such as AlN. The stage 102 is supported by a support member 120 made of ceramic such as AlN and extending upward from the center of the bottom of the processing container 101. A guide ring 181 is provided on the outer edge portion of the stage 102 so as to guide the wafer W. In addition, lifting pins (not illustrated) for raising/lowering the wafer W are provided inside the stage 102 so as to be moved upward and downward with respect to the upper surface of the stage 102. A resistance heater 182 is embedded in the stage 102. The heater 182 heats the wafer W on the stage 102 through the stage 102 based on power provided from a heater power supply 183. A thermocouple (not illustrated) is inserted into the stage 102. The stage 102 is configured to be capable of controlling a heating temperature of the wafer W to a predetermined temperature in a range of, for example, 300 to 1,000 degrees C., based on a signal from the thermocouple. Further, an electrode 184 having a size similar to that of the wafer W is embedded above the heater 182 inside the stage 102. A high-frequency bias power supply 122 is electrically connected to the electrode 184. A high-frequency bias for attracting ions is applied from the high-frequency bias power supply 122 to the stage 102. The high-frequency bias power supply 122 may be omitted depending on the characteristics of plasma processing.

The gas supply mechanism 103 is provided to introduce a plasma-generating gas and a raw material gas for forming a carbon-containing film (a graphene film) into the processing container 101, and has a plurality of gas introduction nozzles 123 provided therein. Each gas introduction nozzle 123 is fitted into a respective opening portion formed in the ceiling wall portion 111 of the processing container 101. A gas supply pipe 191 is connected to the gas introduction nozzles 123. The gas supply pipe 191 is branched into five branch pipes 191a, 191b, 191c, 191d, and 191e. An Ar gas source 192, an $O_2$ gas source 193, a $N_2$ gas source 194, a $H_2$ gas source 195, and a $C_2H_2$ gas source 196 are connected to the branch pipes 191a, 191b, 191c, 191d, and 191e, respectively. The Ar gas source 192 supplies an Ar gas as a noble gas, which is a plasma-generating gas. In addition to the Ar gas, for example, a He gas, a Ne gas, a Kr gas, a Xe gas, or the like may be used as the noble gas. Among these, the Ar gas capable of stably generating plasma is preferable. The $O_2$ gas source 193 supplies an $O_2$ gas as an oxidation gas, which is a cleaning gas. The $N_2$ gas source 194 supplies a $N_2$ gas used as, for example, a purge gas. The $H_2$ gas source 195 supplies a $H_2$ gas as a reducing gas. The $C_2H_2$ gas source 196 supplies an acetylene ($C_2H_2$) gas as a carbon-containing gas, which is a film-forming raw material gas. The $C_2H_2$ gas source 196 may supply a different carbon-containing gas. For example, ethylene ($C_2H_4$), methane ($CH_4$), ethane ($C_2H_6$), propane ($C_3H_8$), propylene ($C_3H_6$), methanol ($CH_3OH$), ethanol ($C_2H_5OH$), or the like may be used. The carbon-containing gas supplied by the $C_2H_2$ gas source 196 is a gas contained in a first carbon-containing gas and a second carbon-containing gas, which will be described later. That is, in the present embodiment, the same carbon-containing gas is used as the gas contained in the first carbon-containing gas and the gas contained the second carbon-containing gas. Further, as the gas contained in the first carbon-containing gas and the gas contained in the second carbon-containing gas, different carbon-containing gases such as acetylene and ethylene may be used.

Although not illustrated, each of the branch pipes 191a, 191b, 191c, 191d, and 191e is provided with a mass flow controller for controlling a flow rate and valves provided on front and back sides of the mass flow controller. It is also possible to adjust the dissociation of gas by providing a shower plate and supplying the $C_2H_2$ gas and the $H_2$ gas to a position close to the wafer W. The same effect can also be obtained by extending the nozzles for supplying these gases downward.

As described above, the microwave introduction device 105 is provided above the processing container 101, and functions as a plasma generator that introduces electromagnetic waves (microwaves) into the processing container 101 so as to generate plasma.

Figure 2:
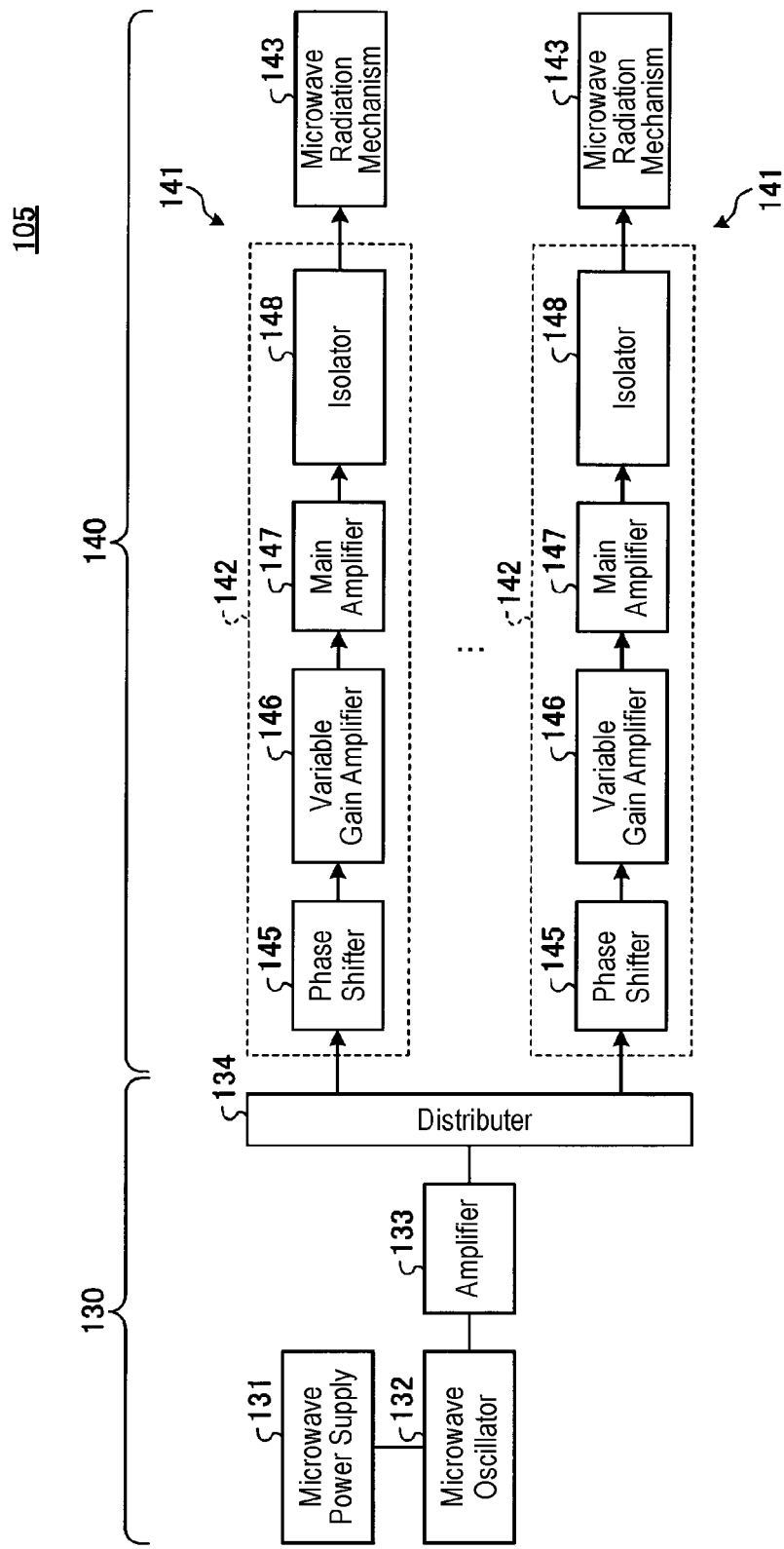
FIG. 2 is a view illustrating an example of a configuration of a microwave introduction device according to the present embodiment.

FIG. 2 is a view illustrating an example of a configuration of the microwave introduction device according to the present embodiment. As illustrated in FIGS. 1 and 2, the microwave introduction device 105 includes the ceiling wall portion 111 of the processing container 101, a microwave output part 130, and an antenna unit 140. The ceiling wall portion 111 functions as a ceiling plate. The microwave output part 130 generates microwaves, and distributes and outputs the microwaves to a plurality of paths. The antenna unit 140 introduces the microwaves output from the microwave output part 130 into the processing container 101.

The microwave output part 130 has a microwave power supply 131, a microwave oscillator 132, an amplifier 133, and a distributor 134. The microwave oscillator 132 is a solid-state, and oscillates the microwaves, for example, at 860 MHz (e.g., PLL oscillation). The frequency of the microwaves is not limited to 860 MHz, and may be a frequency in a range of 700 MHz to 10 GHz, such as 2.45 GHz, 8.35 GHz, 5.8 GHz, 1.98 GHz, or the like. The amplifier 133 amplifies the microwaves oscillated by the microwave oscillator 132. The distributor 134 distributes the microwaves amplified by the amplifier 133 to the plurality of paths. The distributor 134 distributes the microwaves while matching impedances on the input side and the output side.

The antenna unit 140 includes a plurality of antenna modules 141. Each of the antenna modules 141 introduces the microwaves distributed by the distributor 134 into the processing container 101. The configurations of all of the antenna modules 141 are the same. Each antenna module 141 has an amplifier part 142 configured mainly to amplify and output the distributed microwaves, and a microwave radiation mechanism 143 configured to radiate, into the processing container 101, the microwaves output from the amplifier part 142.

The amplifier part 142 has a phase shifter 145, a variable gain amplifier 146, a main amplifier 147, and an isolator 148. The phase shifter 145 changes a phase of the microwaves. The variable gain amplifier 146 adjusts a power level of the microwaves input to the main amplifier 147. The main amplifier 147 is configured as a solid-state amplifier. The isolator 148 separates reflected microwaves, which are reflected at an antenna part of the microwave radiation mechanism 143 (to be described later) and are directed toward the main amplifier 147.

Figure 3:
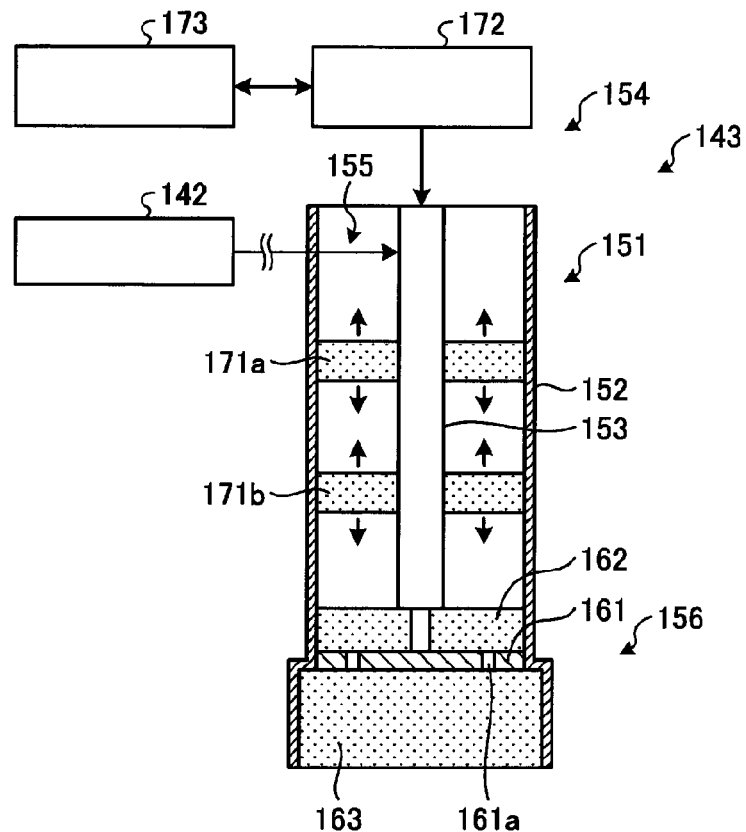
FIG. 3 is a view illustrating an example of a microwave radiation mechanism according to the present embodiment.

Here, the microwave radiation mechanism 143 will be described with reference to FIG. 3. FIG. 3 is a view schematically illustrating an example of the microwave radiation mechanism according to the present embodiment. As illustrated in FIG. 1, a plurality of microwave radiation mechanisms 143 are provided on the ceiling wall portion 111. As illustrated in FIG. 3, each microwave radiation mechanism 143 has a cylindrical outer conductor 152 and an inner conductor 153 provided within the outer conductor 152 in a coaxial relationship with the outer conductor 152. The microwave radiation mechanism 143 includes a coaxial tube 151 having a microwave transmission path provided between the outer conductor 152 and the inner conductor 153, a tuner 154, a power-feeding part 155, and an antenna part 156. The tuner 154 matches the impedance of a load with the characteristic impedance of the microwave power supply 131. The power-feeding part 155 feeds the microwaves amplified by the amplifier part 142 to the microwave transmission path. The antenna part 156 radiates the microwaves from the coaxial tube 151 into the processing container 101.

The microwaves amplified by the amplifier part 142 are introduced from the side of the upper end portion of the outer conductor 152 into the power-feeding part 155 through the coaxial cable. The microwaves are radiated by, for example, a power-feeding antenna. By the radiation of the microwaves, the microwave power is fed to the microwave transmission path between the outer conductor 152 and the inner conductor 153. The microwave power propagates toward the antenna part 156.

The antenna part 156 is provided at the lower end portion of the coaxial tube 151. The antenna part 156 includes a disc-shaped planar antenna 161 connected to the lower end portion of the inner conductor 153, a slow-wave material 162 disposed on the upper surface side of the planar antenna 161, and a microwave transmission plate 163 disposed on the bottom surface side of the planar antenna 161. The microwave transmission plate 163 is fitted into the ceiling wall portion 111. The bottom surface of the microwave transmission plate 163 is exposed to the internal space of the processing container 101. The planar antenna 161 has slots 161a formed to penetrate through the planar antenna 161. The shape of each slot 161a is appropriately set such that the microwaves are efficiently radiated. A dielectric material may be inserted into each slot 161a.

The slow-wave material 162 is formed of a material having a dielectric constant higher than a vacuum. The phase of the microwaves may be adjusted based on the thickness of the slow-wave material 162 such that the radiation energy of the microwaves is maximized. The microwave transmission plate 163 is also made of a dielectric material, and has a shape capable of efficiently radiating the microwaves in a TE mode. Then, the microwaves transmitted through the microwave transmission plate 163 generate plasma in the internal space of the processing container 101. As a material for constituting the slow-wave material 162 and the microwave transmission plate 163, for example, quartz, ceramic, or a fluorine-based resin such as a polytetrafluoroethylene resin, a polyimide resin, or the like may be used.

The tuner 154 constitutes a slug tuner. As illustrated in FIG. 3, the tuner 154 has slugs 171a and 171b, an actuator 172, and a tuner controller 173. The slugs 171a and 171b are two slugs arranged on the base end side (upper end side) of the coaxial tube 151 with respect to the antenna part 156. The actuator 172 drives these two slugs independently of each other. The tuner controller 173 controls the actuator 172.

The slugs 171a and 171b have a plate shape and an annular shape, are made of a dielectric material such as ceramic, and are arranged between the outer conductor 152 and the inner conductor 153 of the coaxial tube 151. Further, the actuator 172 individually drives each of the slugs 171a and 171b, for example, by rotating two screws provided inside the inner conductor 153 and screwed to the slugs 171a and 171b, respectively. Then, based on a command from the tuner controller 173, the actuator 172 moves the slugs 171a and 171b in the vertical direction. The tuner controller 173 adjusts the positions of the slugs 171a and 171b such that the impedance at the terminal end portion becomes 50Ω.

The main amplifier 147, the tuner 154, and the planar antenna 161 are arranged close to one another. The tuner 154 and the planar antenna 161 constitute a lumped constant circuit, and also function as a resonator. An impedance mismatch exists in the mounting portion of the planar antenna 161. However, since the tuner 154 directly tunes the plasma load, the plasma load including plasma may be tuned with high precision. Thus, it is possible to eliminate the influence of reflection on the planar antenna 161.

Figure 4:
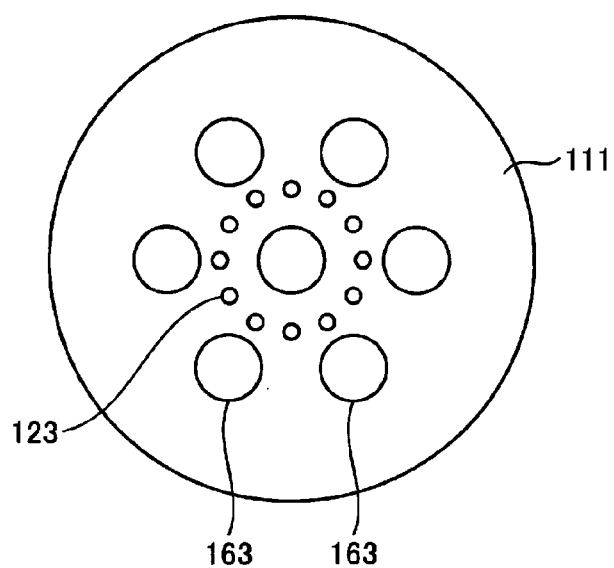
FIG. 4 is a view schematically illustrating an example of a ceiling wall portion of a processing container according to the present embodiment.

FIG. 4 is a view schematically illustrating an example of the ceiling wall portion of the processing container according to the present embodiment. As illustrated in FIG. 4, in the present embodiment, seven microwave radiation mechanisms 143 are provided. Microwave transmission plates 163 corresponding to the seven microwave radiation mechanisms 143 are arranged so as to be evenly arranged in a closely packed hexagonal structure. That is, one of the seven microwave transmission plates 163 is arranged at the center of the ceiling wall portion 111, and the other six microwave transmission plates 163 are arranged around the center. These seven microwave transmission plates 163 are arranged such that adjacent microwave transmission plates 163 are evenly spaced apart from one another. In addition, the plurality of gas introduction nozzles 123 of the gas supply mechanism 103 are arranged so as to surround the periphery of the central microwave transmission plate 163. The number of microwave radiation mechanisms 143 is not limited to seven.

The controller 106 is typically configured with a computer, and controls each part of the processing apparatus 100. The controller 106 includes, for example, a storage part, which stores a process sequence of the processing apparatus 100 and process recipes that are control parameters, an input part, a display and the like, and is capable of performing a predetermined control according to a selected process recipe.

For example, the controller 106 controls each part of the processing apparatus 100 so as to perform a film forming method to be described later. As a detailed example, the controller 106 executes a dummy step of performing a dummy process (dummy film formation) by generating plasma of the first carbon-containing gas in the state in which a dummy substrate (a dummy wafer) is placed on the stage 102 of the processing container 101. The controller 106 executes a placement step of placing the substrate (the wafer W) on the stage 102 of the processing container 101. The controller 106 executes a film forming step of forming a carbon-containing film on the substrate (the wafer W) using plasma of the second carbon-containing gas. Here, as the first carbon-containing gas, the acetylene ($C_2H_2$) gas supplied from the $C_2H_2$ gas source 196 may be used. As the first carbon-containing gas, for example, an ethylene ($C_2H_4$) gas, a methane ($CH_4$) gas, an ethane ($C_2H_6$) gas, a propane ($C_3H_8$) gas, a propylene ($C_3H_6$) gas, a methanol ($CH_3OH$) gas, an ethanol ($C_2H_5OH$) gas, or the like may be used. As the second carbon-containing gas, a mixed gas of the $H_2$ gas supplied from the $H_2$ gas source 195 and the acetylene ($C_2H_2$) gas supplied from the $C_2H_2$ gas source 196 may be used. As the second carbon-containing gas, for example, a mixed gas containing the $H_2$ gas, and one of the ethylene ($C_2H_4$) gas, the methane ($CH_4$) gas, the ethane ($C_2H_6$) gas, the propane ($C_3H_8$) gas, the propylene ($C_3H_6$) gas, the methanol ($CH_3OH$) gas, and the ethanol ($C_2H_5OH$) gas may be used.

[Film Forming Method]

Figure 5:
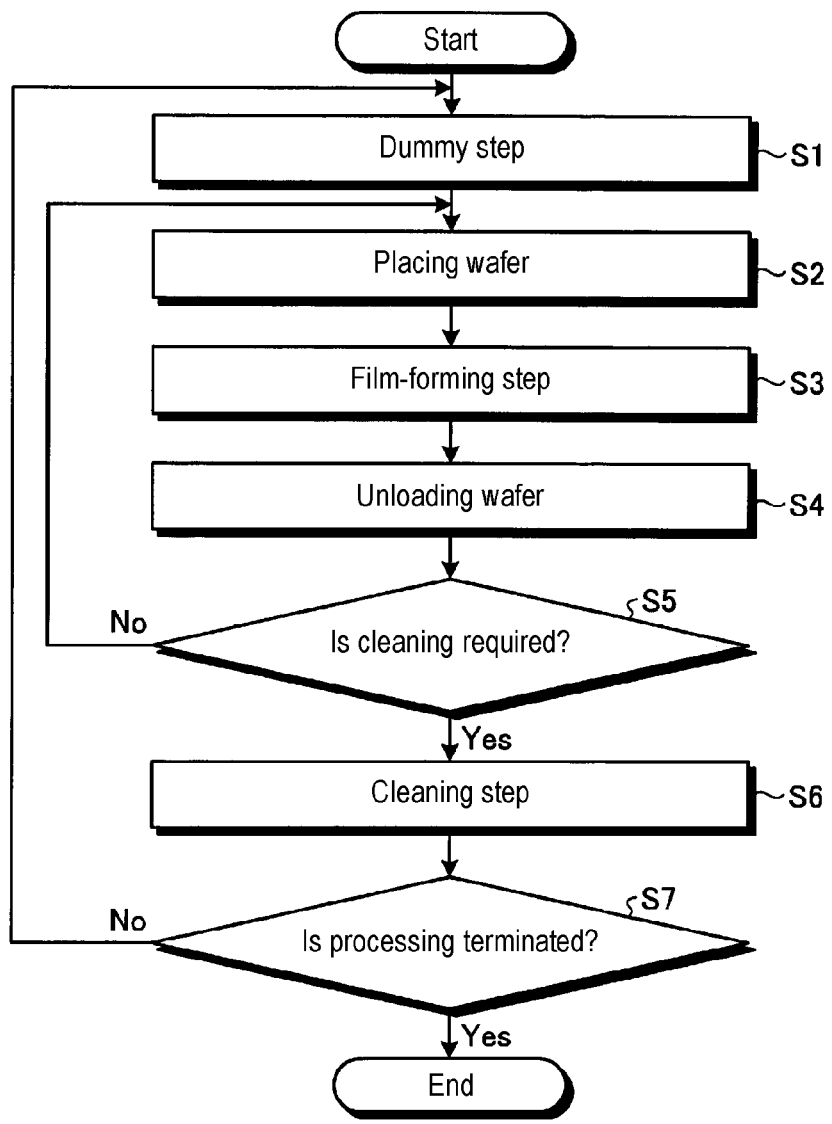
FIG. 5 is a flowchart illustrating an example of a film formation process according to the present embodiment.

First, the film forming method according to the present embodiment will be described. FIG. 5 is a flowchart illustrating an example of the film formation process according to the present embodiment. FIG. 6 is a view illustrating detailed examples of the dummy step and the film forming step according to the present embodiment. In FIG. 6, the same step numbers are used to compare the dummy step and the film forming step.

In the film forming method according to the present embodiment, first, the controller 106 executes the dummy step (step S1). In the dummy step, the controller 106 places a dummy wafer on the stage 102 of the processing container 101. Next, the controller 106 reduces an internal pressure of the processing container 101 to a first pressure (e.g., 0.4 Torr). The controller 106 supplies the $Ar/H_2$ gas, which is a plasma-generating gas, to the processing container 101 from the gas introduction nozzles 123. The controller 106 causes the microwaves, which are distributed into the plurality of paths and output from the microwave output part 130 of the microwave introduction device 105, to be guided into the plurality of antenna modules 141 of the antenna unit 140, and to be radiated from the microwave radiation mechanism 143 so as to ignite plasma.

In each antenna module 141, the microwaves are individually amplified by the main amplifier 147 constituting a solid-state amplifier, are fed to each microwave radiation mechanism 143, and reach the antenna part 156 through the coaxial tube 151. At that time, the impedance of microwaves is automatically matched by the slugs 171a and 171b of the tuner 154. In a state in which there is substantially no power reflection, the microwaves pass from the tuner 154 through the slow-wave material 162 of the antenna part 156, and are radiated from the slots 161a of the planar antenna 161. The microwaves further pass through the microwave transmission plate 163 and are transmitted to the front surface (bottom surface) of the microwave transmission plate 163 which is in contact with the plasma so as to form surface waves. The electric power from each antenna part 156 is spatially synthesized inside the processing container 101 so that surface wave plasma is generated by the $Ar/H_2$ gas in a region directly below the ceiling wall portion 111. This region is defined as a plasma generation region.

Here, details of the dummy step will be described with reference to FIG. 6. As illustrated in FIG. 6, the controller 106 executes pretreatment (pre-processing) with plasma of the $Ar/H_2$ gas on the surface of the dummy wafer for a predetermined time (e.g., 10 minutes) (step S11: dummy). In the description of step S11 in FIG. 6, Ar is omitted.

Specifically, the controller 106 controls each part of the processing apparatus 100 such that the pretreatment is performed under, for example, the following processing conditions.

<Pretreatment of Dummy Step>
Microwave power: 100 to 3,850 W (more preferably, 1,000 to 3,500 W)
Internal pressure of processing container 101: 0.02 to 10 Torr (26.6 to 1,333 Pa)
Processing gas: $Ar/H_2$=0 to 3,000 sccm/1 to 3,000 sccm
Temperature of dummy wafer: 300 to 700 degrees C.
Processing time: 5.0 seconds to 60 minutes When the pretreatment is completed, the controller 106 starts supplying the $Ar/H_2$ gas, which is a plasma-generating gas in plasma CVD, from the gas introduction nozzles 123 (step S12: dummy). The controller 106 controls the microwave introduction device 105 to ignite the plasma, as in the case of the pretreatment (step S13: dummy). The controller 106 reduces the internal pressure of the processing container 101 to a second pressure (e.g., 0.05 Torr) (step S14: dummy) In addition, steps S12 to S14 are steps of stabilizing the gas, the pressure, and the plasma before the plasma CVD.

The controller 106 starts supplying the first carbon-containing gas (the $C_2H_2$ gas), which is a precursor of the plasma CVD, from the gas introduction nozzles 123 into the processing container 101 (step S15: dummy). These gases are excited and dissociated by the plasma, radicals from which ions and electrons are removed are supplied to the dummy wafer, and thus a carbon-containing film (a graphene film) is formed on the dummy wafer. In the dummy step, the carbon-containing film is also formed on the inner wall of the processing container 101. The controller 106 unloads the dummy wafer for which the film formation is completed.

Specifically, the controller 106 controls each part of the processing apparatus 100 such that the plasma CVD is performed under, for example, the following processing conditions.

<Plasma CVD of Dummy Step>
Microwave power: 100 to 3,850 W (more preferably, 1,000 to 3,500 W)
Internal pressure of processing container 101: 0.01 to 5 Torr (1.33 to 667 Pa)
Processing gas: $C_2H_2$ gas=0.1 to 100 sccm
$H_2$=0.1 to 500 sccm
Ar=0.1 to 3,000 sccm
Temperature of dummy wafer: 300 to 700 degrees C.
Processing time: 5.0 seconds to 60 minutes Descriptions will be made referring back to FIG. 5. The controller 106 places the wafer W on the stage 102 of the processing container 101 (step S2). The controller 106 executes the film forming step (step S3). The controller 106 reduces the internal pressure of the processing container 101 to the first pressure (e.g., 0.4 Torr).

Next, details of the film forming step will be described with reference to FIG. 6. As illustrated in FIG. 6, the controller 106 supplies the $Ar/H_2$ gas into the processing container 101, and performs an annealing-based pretreatment on the surface of the wafer W for a predetermined time (e.g., 5 minutes) (step S11: film formation). In the description of step S11 in FIG. 6, Ar is omitted. In the pretreatment of the film forming step, the annealing is used in order to suppress etching of the carbon-containing film formed on the inner wall of the processing container 101 in the dummy step and to prevent the chamber conditions from being disturbed. In the pretreatment of the film forming step, plasma processing may be performed instead of the annealing as long as the chamber conditions are not disturbed.

Specifically, the controller 106 controls each part of the processing apparatus 100 such that the pretreatment is performed under, for example, the following processing conditions.

<Pretreatment of Film Forming Step>
Microwave power: OFF
Internal pressure of processing container 101: 0.01 to 10 Torr (2.66 to 1,333 Pa)
Processing gas: Ar/$H_2$=0 to 3,000 sccm/1 to 3,000 sccm
Temperature of wafer W: 300 to 700 degrees C.
Processing time: 5.0 seconds to 120 minutes When the pretreatment is completed, the controller 106 starts supplying the Ar gas, which is a plasma-generating gas in the plasma CVD, from the gas introduction nozzles 123 (step S12: film formation). The controller 106 controls the microwave introduction device 105 to ignite the plasma (step S13: film formation). The controller 106 reduces the internal pressure of the processing container 101 to the second pressure (e.g., 0.05 Torr) (step S14: film formation). In addition, as in the dummy step, steps S12 to S14 are steps of stabilizing the gas, the pressure, and the plasma before the plasma CVD.

The controller 106 starts supplying the second carbon-containing gas (the $C_2H_2/H_2$ gas), which is a precursor of the plasma CVD, from the gas introduction nozzles 123 into the processing container 101 (step S15: film formation). These gas are excited and dissociated by the plasma, radicals from which ions and electrons are removed are supplied to the wafer W, and thus a carbon-containing film (a graphene film) is formed on the wafer W. In addition, the upper limit of the processing temperature during the film formation is set to be 900 degrees C., and the lower limit thereof is set to be about 300 degrees C.

Specifically, the controller 106 controls each part of the processing apparatus 100 such that the plasma CVD is performed under, for example, the following processing conditions.

<Plasma CVD of Film Forming Step>
Microwave power: 100 to 3,850 W (more preferably, 1,000 to 3,500 W)
Internal pressure of processing container 101: 0.01 to 5 Torr (1.33 to 667 Pa)
Processing gas: $C_2H_2$ gas=0.1 to 100 sccm
$H_2$=0.1 to 500 sccm
Ar=0.1 to 3,000 sccm
Temperature of wafer W: 300 to 700 degrees C.
Processing time: 5.0 seconds to 60 minutes Descriptions will be made referring back to FIG. 5. When the film forming step is completed, the controller 106 unloads the wafer W from the processing container 101 (step S4). The controller 106 determines whether or not the interior of the processing container 101 needs to be cleaned (step S5). For example, the controller 106 determines whether or not the number of wafers W processed inside the processing container 101 after the previous cleaning reaches a predetermined value (e.g., one lot). When it is determined that it is not necessary to clean the interior of the processing container 101 (step S5: "No"), the controller 106 returns to step S2, places a subsequent wafer W, and performs the film forming step on the subsequent wafer W.

When it is determined that the interior of the processing container 101 needs to be cleaned (step S5: "Yes"), the controller 106 executes a cleaning step of cleaning the interior of the processing container 101 (step S6). In the cleaning step, the dummy wafer is placed on the stage 102, and the cleaning gas is supplied into the processing container 101 to clean the interior of the processing container 101.

The controller 106 determines whether or not to end the film formation process following the cleaning step (step S7). When it is determined that the film formation process is not completed (step S7: "No"), the controller 106 returns to step S1 and executes the dummy step. On the other hand, when it is determined that that the film formation process is completed (step S7: "Yes"), the controller 106 ends the film formation process.

[Test Results]

Figure 7:
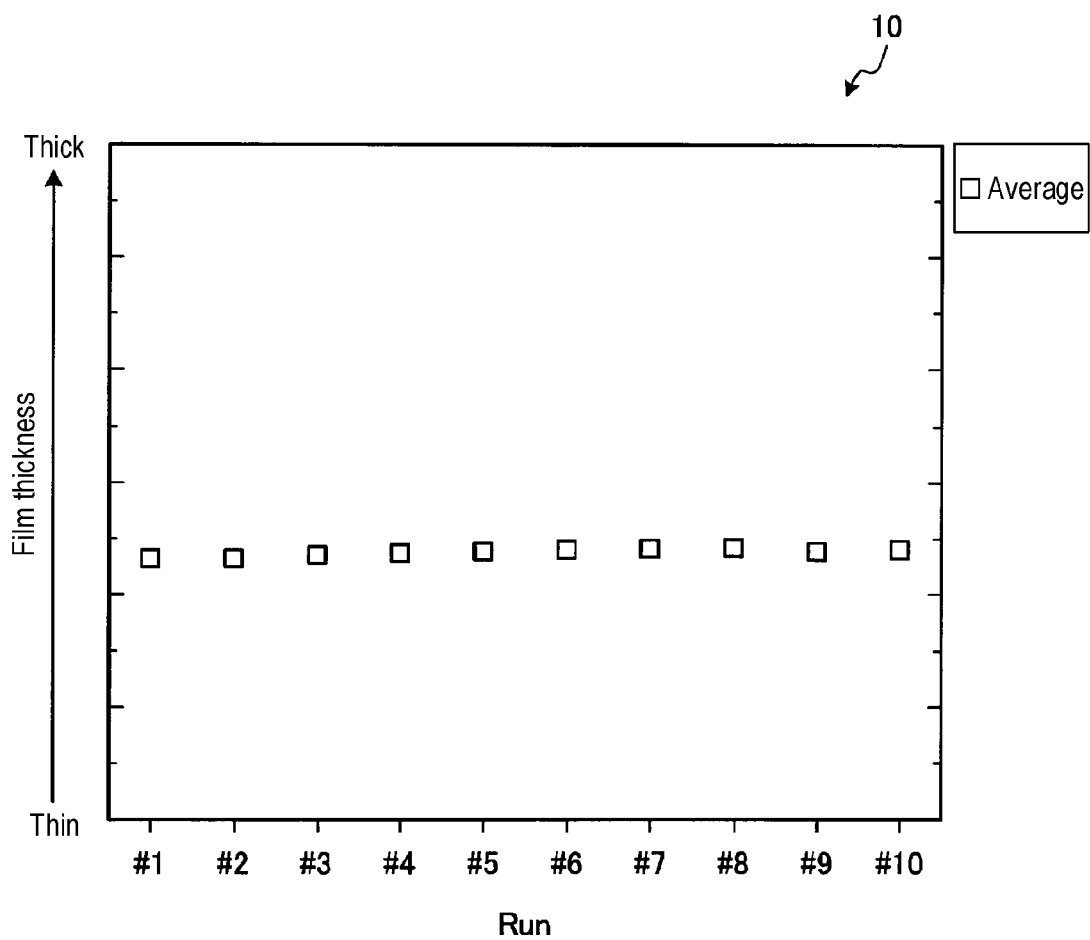
FIG. 7 is a graph illustrating an example of in-plane film thickness distribution of wafers subjected to continuous film formation according to the present embodiment.

A test was conducted to check in-plane film thickness distribution of wafers W subjected to the continuous formation of the graphene film as illustrated in the present embodiment. FIG. 7 is a graph illustrating an example of in-plane film thickness distribution of wafers W subjected to the continuous film formation according to the present embodiment. In a graph 10 illustrated in FIG. 7, the in-plane film thickness distribution when graphene film formation process was performed on 10 sheets of wafers W is shown. As illustrated in the graph 10, it can be seen that the film thicknesses are uniform from the first wafer (Run #1) to the tenth wafer (Run #10). Further, the variation in average film thickness value was 2.4% or less in 16. That is, in the present embodiment, it is possible to improve the film thickness uniformity between the wafers in the continuous film formation.

Figure 8:
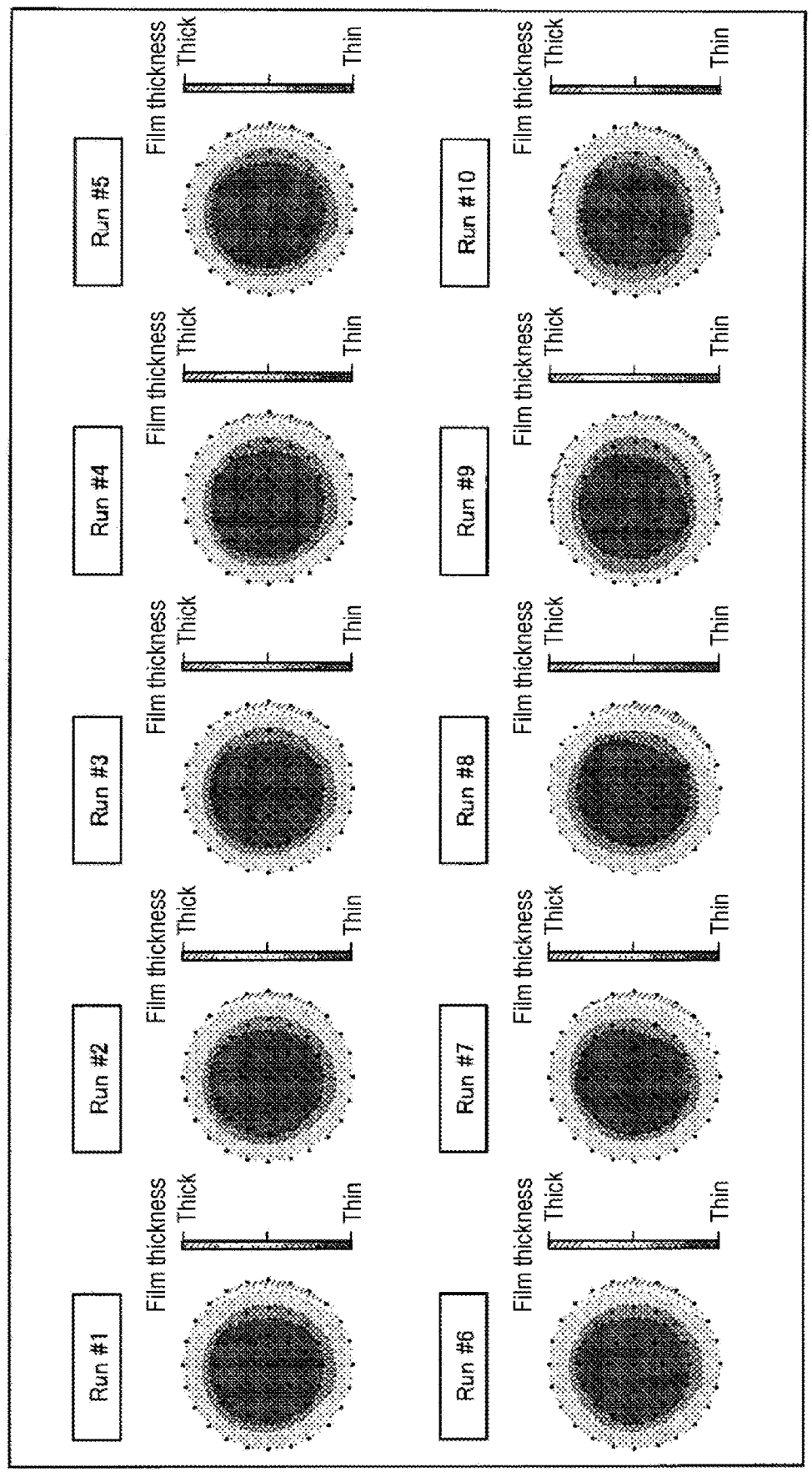
FIG. 8 is a view illustrating an example of in-plane film thickness distribution of wafers subjected to continuous film formation according to the present embodiment.

FIG. 8 is a view illustrating an example of an in-plane film thickness distribution of the wafers on which the continuous film formation was performed according to the present embodiment. FIG. 8 illustrates an in-plane film thickness distribution of each of the wafers W from the first wafer (Run #1) to the tenth wafer (Run #10) in the present embodiment. As illustrated in FIG. 8, it can be seen that the same in-plane film thickness distribution is obtained from the first wafer (Run #1) to the tenth wafer (Run #10). That is, in the present embodiment, it is possible to improve the in-plane film thickness uniformity of each wafer W in the continuous film formation. In other words, it is possible to suppress non-uniformity in in-plane film thickness of each wafer W in the continuous film formation. That is, it is possible to significantly suppress the breakdown in the in-plane thickness distribution of film initially formed in the continuous film formation and to improve the stability of the in-plane film thickness distribution.

Comparative Example

Figure 9:
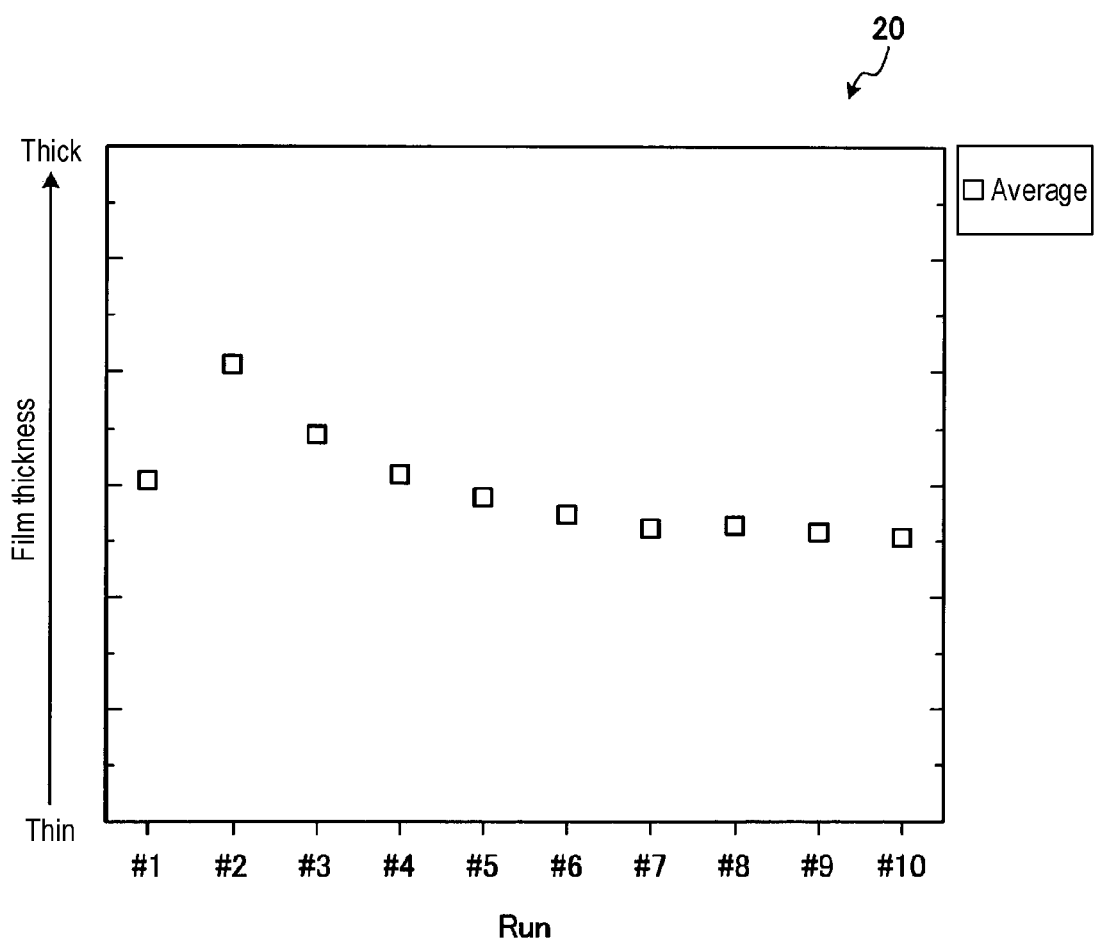
FIG. 9 is a graph illustrating an example of in-plane film thickness distribution of wafers subjected to continuous film formation in a comparative example.

In a comparative example performed in order to compare with the present embodiment, the continuous graphene film formation was performed without performing the dummy step. In the comparative example, in the film forming step, the pretreatment and the plasma CVD were performed under the following processing conditions, which are the same conditions as steps S11 to S15 illustrated in FIG. 6, except for the dummy and the processing time of the plasma CVD.
<Pretreatment of Dummy Step in Comparative Example>:
None
<Plasma CVD of Dummy Step in Comparative Example>:
None
<Pretreatment of Film Forming Step in Comparative Example>
Microwave power: OFF Internal pressure of processing container 101: 0.01 to 10 Torr (2.66 to 1,333 Pa)
Processing gas: $Ar/H_2$=0 to 3,000 sccm/l to 3,000 sccm
Temperature of wafer W: 300 to 700 degrees C.
Processing time: 5.0 seconds to 120 minutes <Plasma CVD of Film Forming Step in Comparative Example>
Microwave power: 100 to 3,850 W (more preferably, 1,000 to 3,500 W)
Internal pressure of processing container 101: 0.01 to 5 Torr (1.33 to 667 Pa)
Processing gas: $C_2H_2$ gas=0.1 to 100 sccm
$H_2$=0.1 to 500 sccm
Ar=0.1 to 3,000 sccm
Temperature of wafer W: 300 to 700 degrees C.
Processing time: 5.0 seconds to 60 minutes FIG. 9 is a graph illustrating an example of in-plane film thickness distribution of wafers subjected to the continuous film formation in the comparative example. In a graph 20 illustrated in FIG. 9, the in-plane film thickness distribution when the graphene film formation process was performed on 10 sheets of wafers W is shown, as the comparative example. As illustrated in the graph 20, it can be seen that the film thicknesses vary from the first wafer (Run #1) to the fifth wafer (Run #5) and thus the film thickness uniformity is not good between the wafers. On the other hand, it can be seen that the film thicknesses are uniform from the sixth wafer (Run #6) to the tenth wafer (Run #10).

FIG. 10 is a view illustrating an example of in-plane film thickness distribution of wafers subjected to the continuous film formation in the comparative example. In FIG. 10, the in-plane film thickness distribution of each wafer W from the first wafer (Run #1) to the tenth wafer (Run #10) is shown in the comparative example. As illustrated in FIG. 10, it can be seen that the in-plane film thickness uniformity is not good in the first sheet (Run #1) to the fifth sheet (Run #5). On the other hand, it can be seen that the similar in-plane film thickness distribution is obtained from the sixth wafer (Run #6) to the tenth wafer (Run #10).

As described above, according to the present embodiment, the processing apparatus 100 is a processing apparatus for forming a carbon-containing film using microwave plasma from a microwave source, and includes the processing container 101 configured to accommodate the substrate, the stage 102 on which the substrate (the wafer W) is placed inside the processing container 101, and the controller 106. The controller 106 executes the dummy step of generating plasma of the first carbon-containing gas inside the processing container 101 to perform the dummy process, the placement step of placing the substrate on the stage 102 inside the processing container 101, and the film forming step of forming the carbon-containing film on the substrate using the plasma of the second carbon-containing gas. As a result, it is possible to improve the film thickness uniformity between the wafers in the continuous film formation.

According to the present embodiment, the controller 106 further executes the cleaning step of cleaning the interior of the processing container 101, which is performed before the dummy step and after the film forming step. As a result, it is possible to further stabilize the chamber conditions in the dummy step.

In addition, according to the present embodiment, the cleaning step is executed in the state in which the dummy substrate is placed on the stage 102. As a result, it is possible to protect the surface of the stage 102.

According to the present embodiment, the dummy step includes performing the plasma processing using the hydrogen-containing gas at a first pressure, generating plasma of the hydrogen-and-argon-containing gas at the first pressure, and generating plasma of the first carbon-containing gas by reducing the internal pressure of the processing container 101 to a second pressure lower than the first pressure and starting the supply of the first carbon-containing gas. As a result, it is possible to stabilize the chamber conditions before the graphene film formation.

According to the present embodiment, the film forming step includes performing the annealing using the hydrogen-containing gas at a first pressure, generating plasma of the argon-containing gas at the first pressure, and generating plasma of the second carbon-containing gas by reducing the internal pressure of the processing container 101 to a second pressure lower than the first pressure and starting the supply of the second carbon-containing gas. As a result, it is possible to form the graphene film on the wafer W under stabilized chamber conditions.

According to the present embodiment, the first carbon-containing gas is the $C_2H_2$ gas, and the second carbon-containing gas is a gas containing the $C_2H_2$ gas and the $H_2$ gas. As a result, it is possible to form the graphene film as a carbon-containing film on the wafer W under stabilized chamber conditions.

According to the present embodiment, the processing time using the plasma of the first carbon-containing gas is longer than that using the plasma of the second carbon-containing gas. As a result, it is possible to stabilize the chamber conditions before the graphene film formation.

In addition, according to the present embodiment, the dummy step is performed in the state in which the dummy substrate is placed on the stage 102. As a result, it is possible to prevent deposits from adhering to the surface of the stage 102 and to suppress the generation of particles.

In addition, according to the present embodiment, the dummy step is executed for each predetermined parameter (e.g., the number of processed wafers, a deposited film thickness, a processing time, and a plasma application time). As a result, it is possible to improve wafer processing capacity per hour.

It should be noted that the embodiments disclosed herein are exemplary in all respects and are not restrictive. The above-described embodiments may be omitted, replaced or modified in various forms without departing from the scope and spirit of the appended claims.

In the above-described embodiment, the pretreatment is performed using the plasma of the $Ar/H_2$ gas in the dummy step, but the present disclosure is not limited thereto. For example, the pretreatment may be performed by annealing using the $Ar/H_2$ gas.

In the above-described embodiment, in the dummy step, the $Ar/H_2$ gas is supplied to ignite plasma in the stabilization steps of the plasma CVD (steps S12 to S14), but the present disclosure is not limited thereto. For example, the Ar gas may be supplied to ignite the plasma.

In the above-described embodiment, the plasma CVD-based processing is performed in the dummy step, but the present disclosure is not limited thereto. For example, other processing such as annealing may be used as long as the processing can stabilize the chamber conditions.

In the above-described embodiment, the dummy step is executed in the state in which the dummy wafer is placed, but the present disclosure is not limited thereto. For example, by controlling the plasma generation region to be limited to the region directly below the ceiling wall portion 111, the dummy step may be executed without placing the dummy wafer on the stage 102.

In the above-described embodiment, the film formation process is started from the dummy step, but the present disclosure is not limited thereto. For example, a pre-coating step of pre-coating the inner wall of the processing container 101 with a carbon-containing film may be performed before the dummy step.

In the above-described embodiment, an aspect in which the graphene film is formed on the wafer W has been described, but the present disclosure is not limited thereto. For example, the present disclosure is also applicable to a case where an amorphous carbon film or a diamond-like carbon film is formed on the wafer W.

In the above-described embodiment, the processing apparatus 100 in which the processing container 101 is provided with the plurality of microwave radiation mechanisms 143 as microwave sources is used, but the present disclosure is not limited thereto. For example, a processing apparatus that radiates microwaves using a single planar slot antenna as a microwave source may be used.

In the above-described embodiment, the ceiling wall portion 111 is provided with the plurality of gas introduction nozzles 123, but the present disclosure is not limited thereto. For example, gas may be supplied through a shower plate provided so as to partition upper and lower portions at a position above the stage inside the processing container.

According to the present disclosure, it is possible to improve the film thickness uniformity between wafers in continuous film formation.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method of forming a carbon-containing film by a microwave plasma from a microwave source, the film forming method comprising:
    a dummy step of performing a dummy process by generating plasma of a first carbon-containing gas within a processing container, the dummy step including:
        performing a plasma processing using a hydrogen-containing gas at a first pressure;
        generating plasma of a hydrogen-and-argon-containing gas at the first pressure; and
        generating the plasma of the first carbon-containing gas by reducing an internal pressure of the processing container to a second pressure lower than the first pressure and starting to supply the first carbon-containing gas;
    a placement step of placing a substrate on a stage within the processing container; and
    a film forming step of forming the carbon-containing film on the substrate using plasma of a second carbon-containing gas.

2. The film forming method of claim 1, further comprising: a cleaning step of cleaning an interior of the processing container before the dummy step and after the film forming step.

3. The film forming method of claim 2, wherein the cleaning step is performed in a state in which a dummy substrate is placed on the stage.

4. The film forming method of claim 1, wherein the film forming step comprises:
    performing an annealing using the hydrogen-containing gas at a third pressure;
    generating plasma of an argon-containing gas at the third pressure; and
    generating the plasma of the second carbon-containing gas by reducing an internal pressure of the processing container to a fourth pressure lower than the third pressure and starting to supply the second carbon-containing gas.

5. The film forming method of claim 4, wherein the first carbon-containing gas is a $C_2H_2$ gas, and the second carbon-containing gas is a gas containing the $C_2H_2$ gas and a $H_2$ gas.

6. The film forming method of claim 5, wherein a processing time using the plasma of the first carbon-containing gas is longer than a processing time using the plasma of the second carbon-containing gas.

7. The film forming method of claim 6, wherein the dummy step is performed in a state in which a dummy substrate is placed on the stage.

8. The film forming method of claim 7, wherein the dummy step is performed for each predetermined parameter of the film forming step.

9. The film forming method of claim 1, wherein the first carbon-containing gas is a $C_2H_2$ gas, and the second carbon-containing gas is a gas containing the $C_2H_2$ gas and a $H_2$ gas.

10. The film forming method of claim 1, wherein a processing time using the plasma of the first carbon-containing gas is longer than a processing time using the plasma of the second carbon-containing gas.

11. The film forming method of claim 1, wherein the dummy step is performed in a state in which a dummy substrate is placed on the stage.

12. The film forming method of claim 1, wherein the dummy step is performed for each predetermined parameter of the film forming step.

13. A processing apparatus for forming a carbon-containing film by a microwave plasma from a microwave source, comprising:
    a processing container in which a substrate is accommodated;
    a stage provided inside the processing container and configured to place the substrate thereon; and
    a controller configured to execute the film forming method of claim 1.

14. A film forming method of forming a carbon-containing film by a microwave plasma from a microwave source, the film forming method comprising:
    a dummy step of performing a dummy process by generating plasma of a first carbon-containing gas within a processing container;
    a placement step of placing a substrate on a stage within the processing container; and
    a film forming step of forming the carbon-containing film on the substrate using plasma of a second carbon-containing gas, the film forming step including:
        performing an annealing using a hydrogen-containing gas at a third pressure;
        generating plasma of an argon-containing gas at the third pressure; and
        generating the plasma of the second carbon-containing gas by reducing an internal pressure of the processing container to a fourth pressure lower than the third pressure and starting to supply the second carbon-containing gas.

15. The film forming method of claim 14, further comprising: a cleaning step of cleaning an interior of the processing container before the dummy step and after the film forming step.

16. The film forming method of claim 15, wherein the cleaning step is performed in a state in which a dummy substrate is placed on the stage.

17. The film forming method of claim 14, wherein the dummy step comprises:
 performing a plasma processing using the hydrogen-containing gas at a first pressure;
 generating plasma of a hydrogen-and-argon-containing gas at the first pressure; and
 generating the plasma of the first carbon-containing gas by reducing an internal pressure of the processing container to a second pressure lower than the first pressure and starting to supply the first carbon-containing gas.

18. The film forming method of claim 14, wherein the first carbon-containing gas is a $C_2H_2$ gas, and the second carbon-containing gas is a gas containing the $C_2H_2$ gas and a $H_2$ gas.

19. The film forming method of claim 14, wherein a processing time using the plasma of the first carbon-containing gas is longer than a processing time using the plasma of the second carbon-containing gas.

20. The film forming method of claim 14, wherein the dummy step is performed in a state in which a dummy substrate is placed on the stage.

21. The film forming method of claim 14, wherein the dummy step is performed for each predetermined parameter of the film forming step.

* * * * *